United States Patent [19]

Takano et al.

[11] Patent Number: 4,586,976
[45] Date of Patent: May 6, 1986

[54] PROCESS FOR PRODUCING PRINTED-WIRING BOARD

[75] Inventors: Satoshi Takano, Osaka; Tadashi Azumakawa, Aichi, both of Japan

[73] Assignee: Sumitomo Electric Industries, Ltd., Osaka, Japan

[21] Appl. No.: 419,278

[22] Filed: Sep. 17, 1982

[30] Foreign Application Priority Data

Sep. 18, 1981 [JP] Japan ................ 56-148332

[51] Int. Cl.⁴ .............. B44C 1/16; B32B 9/04; B32B 31/00; H01R 43/00
[52] U.S. Cl. .................... 156/233; 156/240; 156/241; 156/289; 156/297; 29/825; 428/447
[58] Field of Search .......... 156/230, 233, 249, 325, 156/344, 277, 239, 241, 246, 289, 240, 299; 430/191, 262; 428/450, 901, 447; 29/831, 832, 825; 204/159.13, 157.1 R, 130

[56] References Cited

U.S. PATENT DOCUMENTS

| | | | |
|---|---|---|---|
| 2,984,597 | 5/1961 | Hennes | 156/233 |
| 3,340,607 | 9/1967 | Shutt | 204/15 |
| 3,706,593 | 12/1972 | Miyano et al. | 430/199 |
| 3,782,940 | 1/1974 | Ohto | 430/191 |
| 3,998,601 | 12/1976 | Yates et al. | 156/233 |
| 4,159,222 | 6/1979 | Lebow et al. | 156/233 |
| 4,357,395 | 11/1982 | Lifshin et al. | 156/233 |

Primary Examiner—Edward Kimlin
Assistant Examiner—Louis Falasco
Attorney, Agent, or Firm—Sughrue, Mion, Zinn, Macpeak, and Seas

[57] ABSTRACT

A process for producing a printed-wiring board is disclosed. The process involves providing a metal carried support surface and forming a resist pattern on the metal surface comprised of a silicone rubber material. The support surface where there is not resist is metal plated to provide metal plated surface portions which are contact bonded to a insulating base material by interposing an adhesive between the insulating base material and the metal surface portions or contact bonded to an uncured base material having an adhesive force. The contact bonding is carried out in order to transfer the metal surface portions onto the base material thus forming the conductor pattern on the base material and producing the printing-wiring board. The process eliminates the loss of expensive copper foil and provides a method by which the base material can be securely bonded to the metal portions forming the printed-wiring board.

7 Claims, 2 Drawing Figures

PROCESS FOR PRODUCING PRINTED-WIRING BOARD

FIELD OF THE INVENTION

This invention relates to a process for producing a printed-wiring board and, more particularly, to a process for producing a printed-wiring board which comprises forming a silicone rubber-based resist pattern on a carrier composed of a metal or alloy, metal-plating portions of the carrier where said resist is not formed, then contact bonding the plated surface to an insulating base material while interposing an adhesive therebetween or contact bonding the plated surface to an uncured adhesive base material to thereby transfer the metal skin onto the insulating base material or uncured base material, thus forming a conductor pattern on said insulating base material (hereinafter referred to as a transfer process). The term "silicone rubber" as used in this specification means a siloxane bond (Si-O-Si)-containing silicone resin prepared by polymerizing an organosilicon compound such as dimethylsiloxane, dipnenylsiloxane, phenylmethylsiloxane or vinylmethylsiloxane and having a Young's modulus of up to $10^3$ dyn/cm$^2$, a tensile strength of 20 to 200 Kg/cm$^2$, and an elongation of 100 to 500%, thus showing a rubbery elasticity, and the term a silicone rubber-based means a resist containing 50% or more of the above-described silicone rubber.

BACKGROUND OF THE INVENTION

Printed-wiring boards are generally produced by an etching process which comprises laminating a copper foil on an insulating base material, forming a resist pattern on the copper foil, and etching away portions of the copper foil not covered by the resist to form a conductor pattern.

However, this etching process is not desirable because of the loss of expensive copper foil. Furthermore, the process is complicated because a sophisticated resist pattern must be formed for each board.

A transfer process is desirable because there is no loss of copper foil, and printed-wiring boards can be mass produced by repeating the simple steps of metal-plating and transfer as long as the resist can resist metal-plating and transfer steps. However, it is difficult to repeatedly use ordinary resists for metal or alloy mainly because they interlock with, or adhere to, an adhesive or an uncured base material during the transfer step, and undergo delamination from the carrier or leave the adhesive or uncured base material on the resist.

Another serious problem with the transfer process is shown in FIG. 1. The metal skin 2 enters into uneven surface contact with the resist 3, leading to difficult delamination of the metal skin. Furthermore, upon delamination of the carrier from the base material after the transfer step, delamination takes place between the adhesive and the base material or within the uncured base material, leaving the metal skin on the carrier. This phenomenon can be considerably removed by giving the carrier some curvature. More specifically, the problem is partially eliminated by making the metal-plated surface convex. However, this does not sufficiently eliminate the problem.

SUMMARY OF THE INVENTION

A primary object of the present invention is to provide a method for producing printed-wiring boards in an efficient and effective manner.

Another object of the present invention is to provide a method for producing printed-wiring boards which eliminates the loss of expensive copper foil normally lost in conventional methods.

Yet another object of the present invention is to provide a method for producing printed-wiring boards which can be utilized in mass production in order to easily and quickly produce printed-wiring boards repeatedly.

Still another object of the present invention is to provide a method for producing printed-wiring boards wherein strong adhesion is maintained between the base material and the metal printed circuits being formed on that material to produce the printed-wiring boards.

Another object of the present invention is to provide such a method which eliminates delamination of the carrier from the base material after the transfer step.

These and other objects are obtained by providing a process comprising providing a carrier support surface comprised of a metal and forming a resist pattern on the metal surface. The resist pattern is comprised of a silicone rubber. Metal plating is conducted on portions of the carrier where said resist is not formed to provide metal plated surface potions. Contact bonding is then carried out between the metal plated surface portions and an insulating base material. The metal plated surface portions are then transferred onto the base material thus forming a conductor pattern on the base material and providing the printed-wiring board.

DETAILED DESCRIPTION OF THE INVENTION

Figure 1:
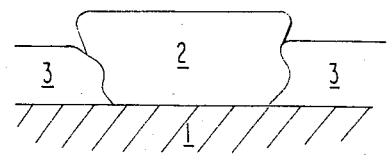
FIG. 1 is a cross sectional view showing a metal skin and a resist in accordance with a conventional method for forming printed-wiring boards.

A silicone rubber does not interlock with, or adhere to, adhesives or uncured base materials of epoxy resins, modified epoxy resins such as acryl-modified epoxy resin, modified phenol resins such as a polyvinyl acetal-modified phenol resin, polyurethane resins or the like used for ordinary printed-wiring boards. In addition, when silicone rubber is used as a resist, the metal skin can be easily delaminated by merely applying pressure when transferring the metal skin. The reason for this phenomenon is not clear. However, it may be attributed to the fact that the resist is soft and that some gaps are formed at the interface between the metal skin and the resist due to deformation of the resist upon the application of pressure. Silicone rubber has such a high water resistance that it is not delaminated even after repeated metal plating and washing with water many times.

Furthermore, since silicone rubber has excellent heat resistance, the metal skin and the adhesive or uncured base material can be adhered together by sufficiently raising the temperature. Another advantage of using silicone rubber-based resist is that it has a high coefficient of friction and has a rubber intrinsic surface tackiness. If we use resist and base material both of which have not tackiness, they easily move across each other and it is difficult to fix base material on resist at a predetermined position. When we use resist and base material which bond strongly to each other and we fix resist at an improper position, it is difficult to correct it. The above characteristic of resist containing silicone rubber facilitates fixing the base material to a predetermined position. This characteristic can be particularly advantageous when using a film-shaped base material containing holes at predetermined positions to be provided on a predetermined position of a carrier board, followed by providing a conductor pattern on the base material.

In the transfer process using a silicone rubber-based resist, a pattern is preferably formed by a printing method, and a screen-printing method is particularly preferred. Therefore, selection of printable silicone rubber is of extreme importance. Useful starting materials for producing ordinary silicone rubber include, silicone compounds, one-part type room temperature curing rubber, and two-part type room temperature curing rubber. Such materials are commercially available for molding, adhesives, templating, or filling. Silicone rubber materials used in the present invention should have excellent selfadhesiveness for metals or alloys. Furthermore, it should be possible to adjust the viscosity of such silicone rubber materials to 100 to 500 CP with a small amount of a comparatively slowly evaporating solvent. In addition, the materials should have proper thixotropic properties. In general, materials which are commercially available as thermosetting silicone adhesives are preferred. Such materials contain a liquid silicone compound as a major component and a solid silicone rubber as a filler and, upon use, a curing catalyst is added thereto. They contain no solvents or contain a small amount of comparatively slowly evaporating solvent such as xylene. Heat-resistant pigments such as ferric oxide, carbon black, titanium oxide, etc. or solvents such as trichloroethane, xylene, etc. may be added thereto for the purpose of adjusting viscosity or coloring it. The use of many one-part type room temperature setting rubbers showing a fast setting speed or many two-part type room temperature setting rubbers showing no self-adhesive properties involves complicated procedures for forming patterns. For example, it may be necessary to apply tape to portions of the carrier board to be metal-plated, apply primer to the entire surface of the carrier board, apply a rubber material thereto, and remove the primer and rubber on the tape.

The resist of the present invention may contain other resins such as fluorine-containing resins in addition to the above-described solvents and pigments. However, catalyst poisons such as sulfur which prevent curing of silicone rubbers and resins which make silicone rubber very fragile must not be incorporated.

The term "silicone rubber" as used in the specification means silicone resin which have a Young's modulus of up to $10^3$ dyn/cm$^2$, a tensile strength of 20 to 200 Kg/cm$^2$, and an elongation of 100 to 500%, thus showing a rubbery elasticity. The term "silicone resin" means resin prepared by polymerizing an organosilicon compound such as dimethylsiloxane, diphenylsiloxane, phenylmethylsiloxane or biphenylsiloxane. The term "resist containing silicone rubbery elasticity" and the term silicone rubber-based resist mean a resist which contains 50% or more of above organosilicon compound and which shows elastic properties like above silicone rubber.

The content of silicone compound after curing is preferably 70 wt % or more.

The process of the present invention can be conducted in accordance with a conventional transfer process except for using a silicone rubber-based resist in the step of forming a resist pattern on a carrier board. For example, a stainless steel plate or foil abraded by #1200 emery paper is used and, after forming a resist thereon, copper plating is conducted using a copper sulfate bath. Transferring procedures are the same as in the conventional transfer process as described hereinafter.

The base material to be used for producing the printed-wiring board of the present invention, may be a conventional base material such as phenol resin plates, laminates of glass-epoxy resin, paper-phenol resin, polyimide films and polyester films. It is also possible to use base materials comprised of core materials such as aluminum which have an insulating layer thereon such as an epoxy resin.

When using flexible base materials, the adhesive may be pre-applied with a roll coater or the like. When using rigid base materials, it is convenient to use a film-like adhesive.

When using rigid base materials, it is preferable to use a foil-like carrier and, after contact bonding the carrier and the base material to each other, the carrier is peeled away thus delaminating it.

Figure 2:
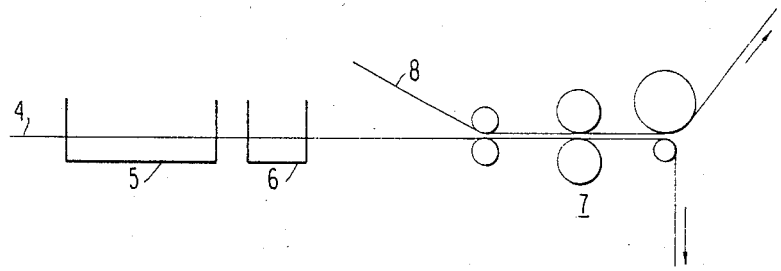
FIG. 2 is a cross sectional prospected view of one embodiment of the present invention for forming printedwiring boards.

After metal plating, the carrier is contact bonded to the base material, mainly by using a press or rollers. If a foil is used as a carrier, handling of the metal-plated carrier is difficult because the metal skin can be partially delaminated by bending. Therefore, it is preferable to carry out metal plating and contact bonding in a continuous manner. For example, as is shown in FIG. 2, a foil 4 having formed thereon a resist pattern is allowed to run continuously. A metal skin layer is formed in a metal-plaing bath 5, and washed in a water-washing bath 6. After drying, they are contact bonded to a base material 8 between a pair of rollers 7. Delamination of the carrier and the base material 8 from each other is preferably conducted continuously by providing some curvature so that the metal-plated surface is on a convex side, as shown in FIG. 2.

When carrying out the transferring step using rollers, it is difficult to provide enough heat to thermally set the adhesive on the base material so as to strongly bond metal skin to the base material since retention time is comparatively short and therefore, an adhesive having a strong adhesiveness for the metal skin should be used. However, by using a press in the transfer step it is possible to provide sufficient retention time to obtain a strong adhesive force by thermal setting. The temperature and pressure used in the rolling or pressing step are decided depending upon the adhesive used. When using rollers in the transfer step, it is preferable to use an adhesive having as strong an adhesive force as possible and to apply a pressure of 5 to 70 Kg/cm$^2$ at a temperature of from room temperature to 100° C. When using a press in the transfer step, it is preferable to apply a pressure of 5 to 50 Kg/cm$^2$ at a temperature near the setting temperature of the adhesive. In both cases, it is preferable to uniformly apply pressure by using cardboard or rubber as a cushion.

Contact bonding using rollers generally produces less adhesion force than if a press is used. Therefore, contact bonding by rollers is suitably applied to foil-shaped carrier, because roller-transfer facilitates delamination of the metal skin by giving the carrier some curvature.

However, when using rollers or a press the use of a silicone rubber-based resist is extremely effective in order to completely transfer the metal skin. This effect cannot be obtained by an ordinary resist while preventing interlocking or adhesion between the resist and the adhesive by coating a silicone parting agent.

The present invention will now be described in more detail by the following non-limiting examples of the preferred embodiments of the present invention.

EXAMPLE 1

A carrier plate was prepared by plating an iron plate with chromium. A room temperature vulcanizing silicone rubber (KE-42RTV which is made by Shinetsu Silicone Co., Ltd., contains mainly organosiloxane and shows greasy before vulcanizing and rubberry elasticity of the tensile strength of about 20 Kg/mm$^2$ and elongation of about 400% after vulcanizing) was screen-printed thereon to form a pattern, followed by setting it at room temperature to form a resist. Copper was plated thereon to a thickness of 35$\mu$ in a copper pyrophosphate plating solution. The copper plating was then transferred to a polyimide film using an epoxy type adhesive. Contact bonding was conducted with a press at 170° C. and 20 Kg/cm$^2$ for 10 minutes. Upon delaminating the polyimide film from the carrier plate, no adhesive remained on the resist surface, and there was produced a printed-wiring board with a good appearance.

EXAMPLE 2

A 0.1 mm-thick stainless steel foil was used as a carrier. A heat vulcanizing silicone rubber (KE-104 which is made by Shinetsu Silicone Co., Ltd., contains mainly organosiloxane, shows gelly before vulcanizing and rubbery elasticity after vulcanizing) having autohesion properties was screen-printed thereon. Thereafter, setting was carried out to 120° C. for 10 minutes, and copper was plated thereon to a thickness of 25$\mu$ in a copper sulfate plating solution. The metal skin was contact bonded to a polyester film between rollers using an urethane type adhesive.

The stainless steel foil and the polyester film were allowed to run horizontally at the entrance of the rollers and, as they left the rollers, the stainless steel foil was wound up in a 45° upward direction, and the polyester film was wound in a 45° downward direction.

The copper skin was completely transferred to the polyester film, and no adhesive remained on the resist.

EXAMPLE 3

A stainless steel plate was used as a carrier plate. A resist was formed with a heat vulcanizing silicone rubber (SE-1700 which is made by Toray Silicone Co., Ltd., contains mainly organosiloxane, shows fluidity and has viscosity of about 700 poise before vulcanizing and rubbery elasticity of tensile strength of 60 Kg/mm$^2$ and elongation of 250% after vulcanizing at 120° C. and during 15 minutes). Setting was carried out at 120° C. for 10 minutes and nickel was then plated thereon to a thickness of 50$\mu$ in a Watts bath. The nickel skin was transferred to a polyimide film with a press and an epoxy type adhesive. After pressing at 165° to 180° C. for 15 minutes applying a pressure of 30 Kg/cm$^2$, the nickel skin was completely transferred to the polyimide film.

Comparative Example

A resist was formed as in Example 3 except for using an epoxy type resist ink (16935-PC, made by U.S. Nazdar Co. Int., the resin of this ink is mainly epoxy) in place of the silicone adhesive. Furthermore, setting was carried out at 125° C. for 10 minutes and a silicone parting agent SH-7020 (made by Toray Silicone Co., Ltd.) was thinly applied thereto to give parting properties. Metal plating and transfer were then conducted in the same manner as in Example 3. Part of the metal skin was not delaminated even though the polyimide film was easily delaminated from the resist. Although no adhesive remained on the resist, the adhesive remained on the remaining metal skin. Thus, it was found that, in this portions, delamination took place between the polyimide film and the adhesive.

While the invention has been described in detail and with reference to specific embodiment thereof, it will be apparent to one skilled in the art that various changes and modifications can be made therein without departing from the spirit and scope thereof.

What is claimed is:

1. A process for producing a printedwiring board, comprising the steps of:
   providing a carrier support surface comprised of a metal;
   forming a resist pattern on the metal surface, the resist pattern being formed of a composition containing 50% or more of a silicone rubber having rubbery elasticity and a Young's modulus of up to 10$^3$ dyn/cm$^2$, a tensile strength of 20 to 200 kg/cm$^2$, and an elongation of 100 to 500%:
   metal plating the metal surface where there is no resist to provide metal plated surface portions;
   contact bonding the metal plated surface portions to an insulating base material; and
   transferring the metal plated surface portions onto the insulating base material, thus forming a conductor pattern on the insulating base material and forming the printed-wiring board.

2. A process for producing a printed-wiring board as claimed in claim 1, wherein the carrier support surface is comprised of a metal alloy.

3. A process for producing a printed-wiring board as claimed in claim 1, wherein the carrier support surface is comprised of a stainless steel.

4. A process for producing a printed wiring board as claimed in any of claims 1 or 2, wherein the base material is an insulating base material which is bonded to the metal plated surface portions by interposing an adhesive between the metal plated surface portions and the insulated base material.

5. A process for producing a printed-wiring board as claimed in any of claims 1 or 2, wherein the base material is an uncured base material having an adhesive force capable of bonding to the metal plate surface portions.

6. A process for producing a printed-wiring board as claimed in claim 1, wherein the metal plated surface portions are contact bonded to be the base material by utilizing a roller and applying a pressure of 5 to 70 Kg/cm$^2$ at a temperature from about 20° C. to about 100° C.

7. A process for producing a printed-wiring board as claimed in claim 1, wherein the contact bonding of the metal plated surface portions to the base material is carried out by a pressed transfer, by applying a pressure of 5 to 50 Kg/cm$^2$.

* * * * *